(12) United States Patent
Yamazaki (10) Patent No.: US 6,770,555 B2
(45) Date of Patent: *Aug. 3, 2004

(54) PROCESS FOR FABRICATING SEMICONDUCTOR INTEGRATED CIRCUIT DEVICE HAVING POLYCIDE LINE AND IMPURITY REGION RESPECTIVELY EXPOSED TO CONTACT HOLES DIFFERENT IN DEPTH (75) Inventor: Yasushi Yamazaki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 563 days.

(21) Appl. No.: 09/247,926

(22) Filed: Feb. 11, 1999

(65) Prior Publication Data
US 2002/0001938 A1 Jan. 3, 2002

(30) Foreign Application Priority Data

Feb. 13, 1998 (JP) ............................................ 10-030709

(51) Int. Cl.$^7$ .......................................... H01L 21/4763
(52) U.S. Cl. ........................ 438/620; 438/637; 438/657
(58) Field of Search ................................ 438/620, 655, 438/657, 637; 257/68–71, 298, 296, 300

(56) References Cited

U.S. PATENT DOCUMENTS

| 4,933,297 A | * | 6/1990 | Lu ................................ 437/41 |
| 5,022,958 A | * | 6/1991 | Favreau et al. ............. 156/643 |
| 5,180,464 A | * | 1/1993 | Tatsumi et al. ............. 156/626 |
| 5,298,463 A | * | 3/1994 | Sandhu et al. .............. 437/192 |
| 5,827,764 A | * | 10/1998 | Liaw et al. .................. 438/238 |
| 5,899,735 A | * | 5/1999 | Tseng .......................... 438/592 |

FOREIGN PATENT DOCUMENTS

JP          60-15950         1/1985

* cited by examiner

Primary Examiner—Erik J. Kielin
(74) Attorney, Agent, or Firm—Sughrue Mion, PLLC (57) ABSTRACT When contact holes are concurrently formed in an inter-level insulating layer over an impurity region in a silicon substrate and a polycide line on a thick field oxide layer, the manufacturer interrupts the etching at the refractory metal silicide layer of the polycide line, and restarts the etching after removal of a part of the refractory metal silicide layer exposed to the short contact hole, thereby preventing the impurity region from undesirable etching for the refractory metal silicide layer.

40 Claims, 7 Drawing Sheets

PROCESS FOR FABRICATING SEMICONDUCTOR INTEGRATED CIRCUIT DEVICE HAVING POLYCIDE LINE AND IMPURITY REGION RESPECTIVELY EXPOSED TO CONTACT HOLES DIFFERENT IN DEPTH

FIELD OF THE INVENTION

This invention relates to a process for fabricating a semiconductor integrated circuit device and, more particularly, to a process for fabricating a semiconductor device having contact holes to a polycide signal line and an impurity region.

DESCRIPTION OF THE RELATED ART

The integration density of semiconductor integrated circuit has been increased through a scaling down of circuit components/signal lines. The signal lines of a semiconductor integrated circuit device are getting narrow. The narrow signal line increases the resistance against an electric signal, and the large-resistance signal line retards the signal propagation. In order to decrease the resistance, a polycide structure has been proposed for the signal line. The polycide structure is a lamination of a polysilicon layer and a refractory metal silicide. A multi-layered wiring structure is employed in the semiconductor integrated circuit device, and upper-level signal lines are connected to lower-level signal lines through contact holes. The contact holes are also miniaturized in the semiconductor integrated circuit device. If conductive metal is deposited over an inter-level insulating layer having miniature contact holes by using a sputtering technique, the step-coverage is poor, and the conductive metal does not fill the miniature contact holes. If the conductive metal layer is patterned into an upper-level signal line, the contact resistance between the upper-level signal line and a lower-level signal line is large or unstable between products. For this reason, it is not desirable to deposit the conductive metal over the inter-level signal line through the sputtering.

Polysilicon is usually deposited through a chemical vapor deposition, and the step coverage is improved. For this reason, it is appropriate to form the upper-level signal layer of polysilicon or the upper-level signal line with the polycide structure. When a manufacturer connects an upper-level polycide line through a miniature contact hole to a lower-level polycide line, the manufacturer encounters a problem in large contact resistance between the polysilicon layer of the upper-level polycide line and the refractory metal silicide layer of the lower-level polycide line.

A solution is proposed in Japanese Patent Publication of Unexamined Application No. 60-15950. According to the solution disclosed in the Japanese Patent Publication of Unexamined Application, the refractory metal silicide layer is partially removed from the lower-level polycide line, and the polysilicon layer of the upper-level polycide layer is directly connected through a contact hole to the exposed polysilicon layer of the lower-level polycide line. The direct contact between the polysilicon layers decreases the contact resistance.

Figure 1A:
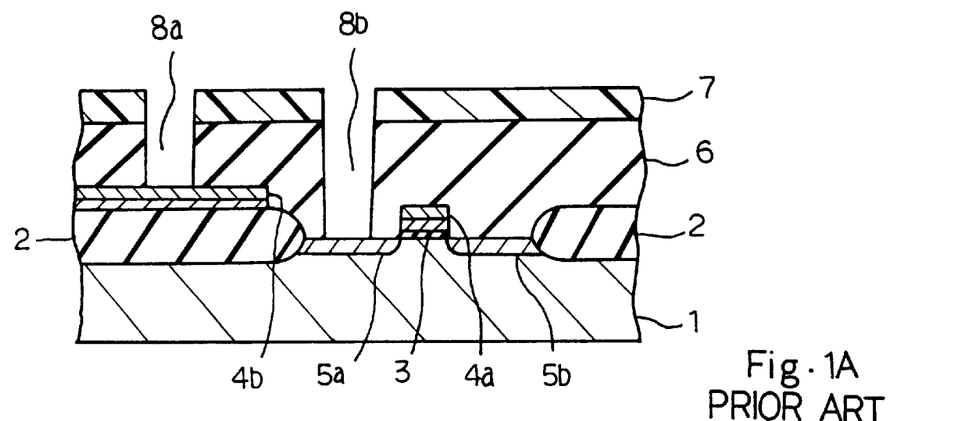
FIGS. 1A to 1C are cross sectional views showing the prior art process for forming the contact holes disclosed in Japanese Patent Publication of Unexamined Application No. 60-15950.
Figure 1B:
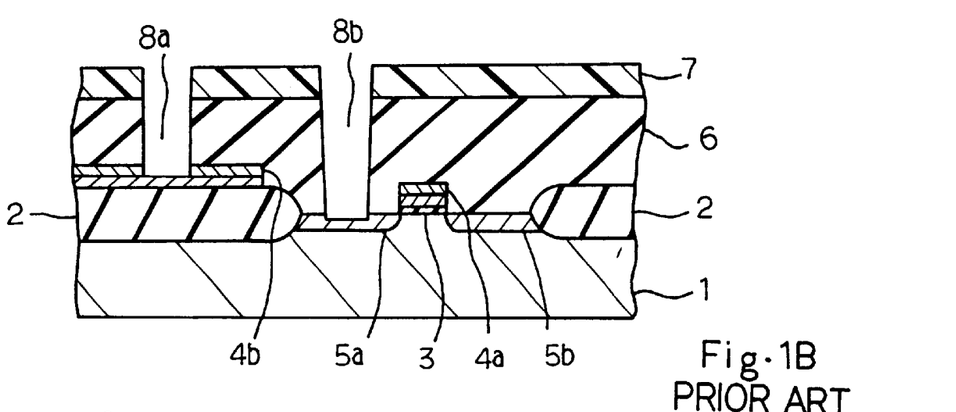
Figure 1C:
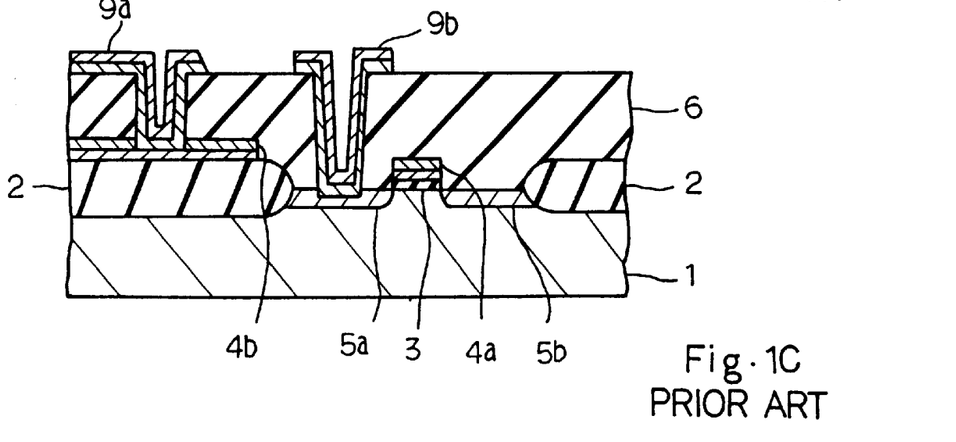

When a manufacturer forms the direct contact between the polysilicon layers in a semiconductor dynamic random access memory device, the direct contact is realized through a process shown in FIGS. 1A to 1C.

The prior art process starts with preparation of a silicon substrate 1, and a field oxide layer 2 is selectively grown on the major surface of the silicon substrate 1. The field oxide layer 2 defines an active area in the major surface, and the active area is oxidized so that a gate oxide layer 3 is grown.

Polysilicon is deposited over the entire surface of the resultant structure, and refractory metal silicide is laminated on the polysilicon layer. The refractory metal silicide layer is produced through an alloying technique between the polysilicon layer and a refractory metal layer. Word lines 4a/4b are expected to be low in resistance, and the polysilicon layer and the refractory metal silicide layer are thick. In this instance, the polysilicon layer is 1000 angstroms thick, and the refractory metal silicide layer is also 1000 angstroms thick. A photo-resist etching mask is formed on the refractory metal silicide layer by using photo-lithographic techniques, and the lamination is patterned into word lines 4a/4b. The word lines 4a/4b have the polycide structure, and a part of the word line 4a serves as a gate electrode on the gate oxide layer 3.

Subsequently, n-type dopant impurity is ion implanted into the active area, and forms n-type source/drain regions 5a/5b on both side of the channel region under the gate oxide layer 3. Insulating material is deposited over the entire surface of the resultant semiconductor structure, and forms an interlevel insulating layer 6. A photo-resist etching mask 7 is formed on the interlevel insulating layer 6 by using the lithographic techniques, and has openings over the word line 4b and the n-type drain region 5a. Using the photo-resist etching mask, the inter-level insulating layer 6 is selectively etched through a reactive ion etching technique. The reactive ion etching is continued for a time long enough to reach the surface of the n-type drain region 5a, because the n-type drain region 5a is deeper than the word line 4b. The time for the reactive ion etching is, by way of example, seventy seconds. Contact holes 8a/8b are formed in the inter-level insulating layer 6, and the word line 4b and the n-type drain region 5a are exposed to the contact holes 8a and 8b, respectively, as shown in FIG. 1A. Although the reactive ion etching is continued after reaching the refractory metal silicide layer of the word line 4b, the refractory metal silicide layer is resistive against the etchant, and the contact holes 8a/8b different in depth are concurrently formed in the interlevel insulating layer 6.

Subsequently, the resultant semiconductor structure is subjected to a dry etching or a plasma etching, and the refractory metal silicide layer of the word line 4b is partially etched away. As a result, the polysilicon layer of the word line 4b is exposed to the contact hole 8a as shown in FIG. 1B. The photo-resist etching mask 7 is stripped off.

Polysilicon is deposited over the entire surface of the semiconductor structure, and the polysilicon layer is held in contact with the polysilicon layer of the word line 4b and the n-type drain region 5a in the contact holes 8a/8b. Subsequently, refractory metal is deposited over the polysilicon layer. The refractory metal is converted to refractory metal silicide, and the refractory metal silicide layer is laminated on the polysilicon layer. A photo-resist etching mask (not shown) is formed on the refractory metal silicide layer, and the refractory metal layer and the polysilicon layer are selectively etched away. Upper-level signal lines 9a and 9b are formed on the inter-level insulating layer 6, and have the polycide structure as shown in FIG. 1C.

The polysilicon layers of the upper-level signal lines 9a/9b are directly held in contact with the polysilicon layer of the word line 4b and the n-type drain region 5a of the single crystal silicon. For this reason, low contact resistance is achieved through the prior art fabrication process.

However, the manufacturer encounters a problem in that leakage current flows between the upper-level signal line 9b and the silicon substrate 1.

SUMMARY OF THE INVENTION

It is therefore an important object of the present invention to provide a fabrication process through which contact holes different in depth are concurrently formed without increase of contact resistance and the serious leakage current.

Figure 2:
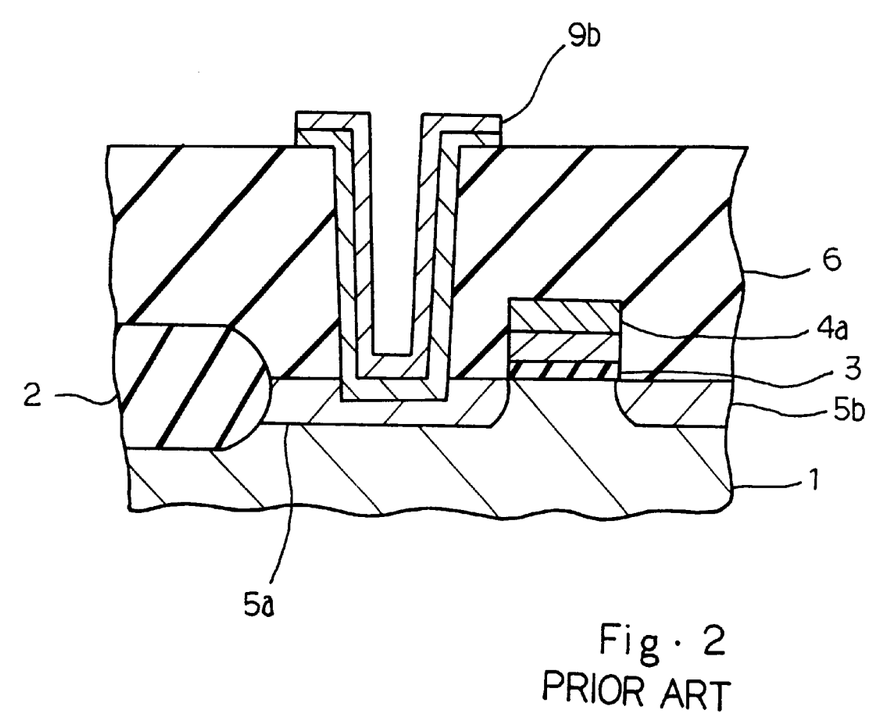
FIG. 2 is a cross sectional view showing, in a large scale, the structure around the drain region of the prior art dynamic random access memory device.

The present inventor contemplated the problem inherent in the prior art structure, and noticed that the drain region had been depressed as shown in FIG. 2. The present inventor thought that the etchant had removed the surface portion of the drain region 5a during the dry etching for the refractory metal silicide. As described hereinbefore, the word lines 4a/4b had the refractory metal silicide layer of the order of 1000 angstroms thick, and the dry etching was continued for the long time. Even though the manufacturer used the dry etchant large in selectivity, the drain region 5a was partially etched, and the depression was unavoidably formed in the drain region 5a. The source/drain regions 5a/5b were getting shallow, and the reduction in depth seriously affected the electrical isolation between the drain region 5a and the silicon substrate 1. The present inventor concluded that the dry etching for the refractory metal silicide was never ignorable in the semiconductor integrated circuit device of the next generation. If the deep contact hole 8b were covered with a photo-resist etching mask, the drain region 5a would be prevented from the dry etchant. However, the photo-resist etching mask made the process complicated. Moreover, it was difficult to remove the photo resist from the deep contact hole 8b after the dry etching.

To accomplish the object, the present invention proposes to remove a refractory metal silicide layer from a lower polycide line before completion of a deep contact hole.

In accordance with one aspect of the present invention, there is provided a process for fabricating a semiconductor device comprising the steps of preparing a semiconductor structure including a first lower-level conductive line having a semiconductor layer and a refractory metal silicide layer laminated on the semiconductor layer and a second lower-level conductive line without a refractory metal silicide layer, forming an inter-level insulating layer over the semiconductor structure having a first portion over the first lower-level conductive line and a second portion over the second lower-level conductive line, etching the first portion and the second portion until the refractory metal silicide layer of the first lower-level conductive line is exposed to a first contact hole, the second lower-level conductive line being still covered with a remaining second portion, removing a part of the refractory metal silicide layer exposed to the first contact hole from the first lower-level conductive line and etching the remaining second portion for exposing the second lower-level conductive line to a second contact hole.

BRIEF DESCRIPTION OF THE DRAWINGS

The features and advantages of the fabrication process will be more clearly understood from the following description taken in conjunction with the accompanying drawings in which.

DESCRIPTION OF THE PREFERRED EMBODIMENTS

Figure 3:
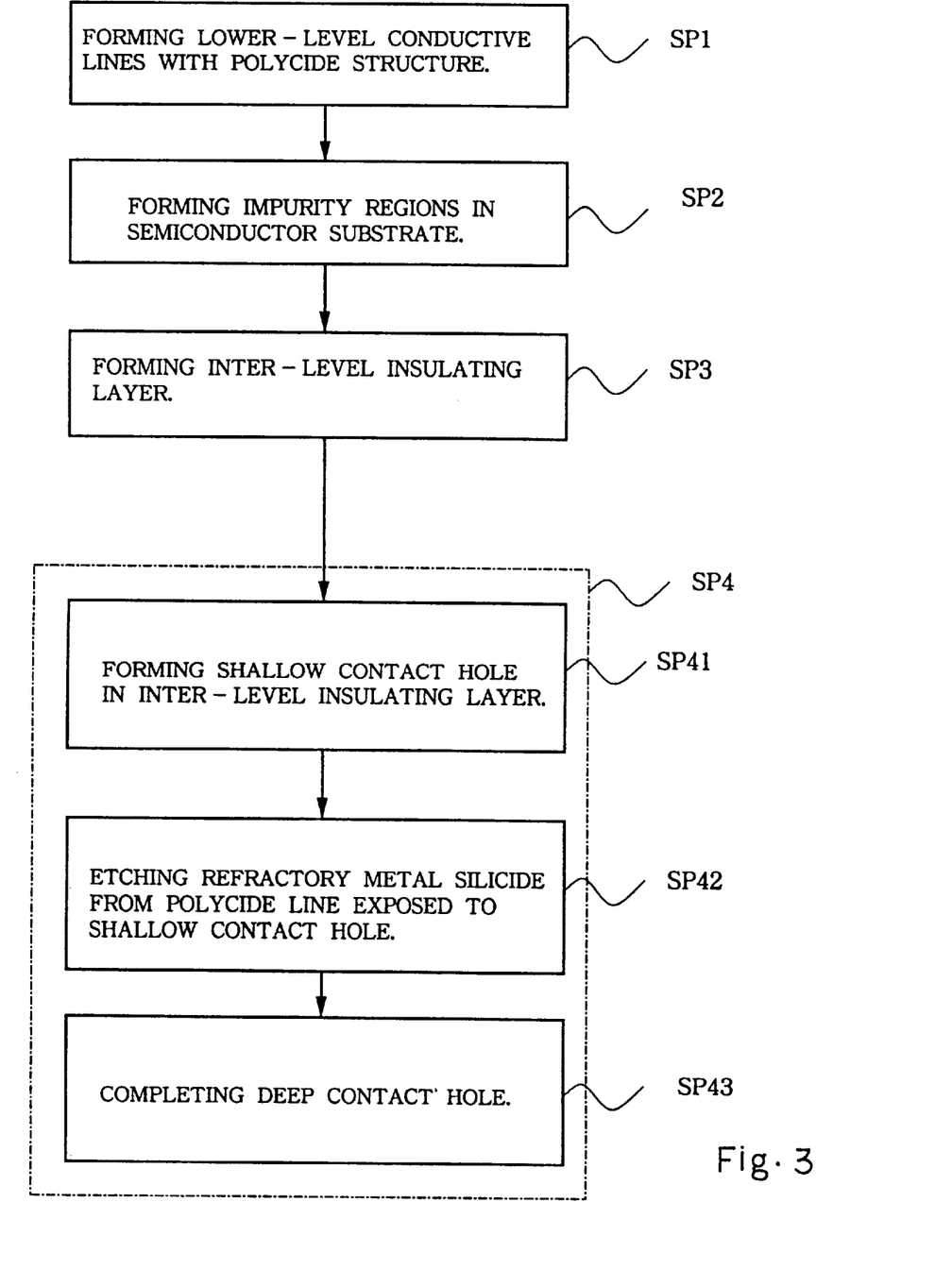
FIG. 3 is a flow chart showing essential steps of a process for fabricating a semiconductor integrated circuit device according to the present invention.

FIG. 3 illustrates essential steps of a process embodying the present invention. The process contains the step of forming lower-level conductive lines over a semiconductor substrate, and the step is labeled with SP1. In this instance, the lower-level conductive lines have the polycide structure, i.e., the laminated structure of a polysilicon layer and a refractory metal silicide layer. The lower-level conductive lines with the polycide structure are simply referred to as "polycide lines" hereinbelow.

The step SP1 is followed by step SP2. In the step SP2, impurity regions are formed in the semiconductor substrate. The polycide lines extend on a level higher than the impurity regions. In this instance, the impurity regions are self-aligned with selected one or ones of the polycide lines, and serve as other lower-level conductive lines. The self-alignment is not indispensable feature of the present invention, and the impurity regions may be formed in the semiconductor substrate independently of the polycide lines.

The step SP2 is followed by step SP3. The polycide lines and the impurity regions are covered with an inter-level insulating layer in the step SP3. The inter-level insulating layer is different in thickness between a portion over the impurity region and another portion over the polycide line. When insulating material is deposited over a non-flat surface, the non-flat configuration may be transferred to the upper surface of the inter-level insulating layer. In order to make the inter-level insulating layer over the polycide lines thinner than the inter-level insulating layer over the impurity regions, the inter-level insulating layer may be polished.

The step SP3 is followed by step SP4. In the step SP4, contact holes are formed in the inter-level insulating layer. The inter-level insulating layer is different in thickness, and, accordingly, the contact hole over the impurity region is deeper than the contact hole over the polycide line. The contact hole over the polycide line and the contact hole over the impurity region are referred to as "shallow contact hole" and "deep contact hole", respectively. The step SP4 is broken down into sub-steps SP41, SP42 and SP43.

In the sub-step SP41, the inter-level insulating layer is selectively etched away until the refractory metal silicide is exposed to the shallow contact hole. For the selective etching, an appropriate etching mask may be formed on the inter-level insulating layer. The shallow contact hole is firstly completed in the process according to the present invention. A part of the refractory metal silicide layer is exposed to the shallow contact hole, and the deep contact hole is incomplete.

Subsequently, the part of the refractory metal silicide layer is etched away from the polycide line in the sub-step SP42. The impurity region is still covered with the insulating layer, and the impurity region is never etched away in the sub-step SP42.

After the removal of the refractory metal silicide, the inter-level insulating layer is selectively etched away in the sub-step SP43 until the impurity region is exposed to the deep contact hole. The etching mask may prevent the other portion of the inter-level insulating layer from the etchant. When the impurity region is exposed, the deep contact hole is completed, and the etching is stopped. As a result, any depression is formed in the surface portion of the impurity region.

Though not shown in FIG. 3, upper-level conductive lines are formed on the inter-level insulating layer, and are held in contact with the polycide line and the impurity region, respectively. The upper-level conductive line held in contact with the polycide line may have the polycide structure, and the polysilicon layer of the upper-level conductive line is directly held in contact with the polysilicon layer of the lower-level conductive line. This results in reduction of contact resistance. Moreover, the impurity region is not substantially etched away, and remains thick enough to prevent the semiconductor structure from leakage current.

The process described hereinbefore is applicable to fabrication of a semiconductor dynamic random access memory device as shown in FIGS. 4A to 4H. The process starts with preparation of a p-type silicon substrate 21. The major surface of the silicon substrate 21 is thermally oxidized, and the major surface is covered with a silicon oxide layer 22. Silicon nitride is deposited over the silicon oxide layer 22, and a silicon nitride layer 23 is laminated on the silicon oxide layer 22. Photo-resist solution is spread over the silicon nitride layer 23, and is baked so that a photo-resist layer (not shown) is laminated on the silicon nitride layer 23. A pattern image for active areas is transferred from a photo-mask to the photo-resist layer, and a latent image for active areas is formed in the photo-resist layer. The latent image is developed, and a photo-resist etching mask (not shown) is formed on the silicon nitride layer 23. In other words, the photo-resist etching mask is formed by using photo-lithographic techniques.

Figure 4A:
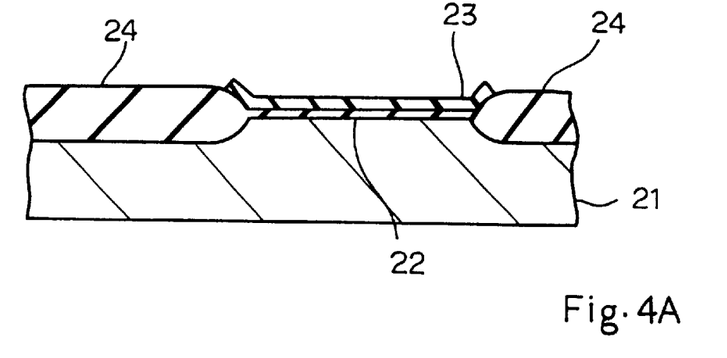
FIGS. 4A to 4H are cross sectional views showing a process for fabricating a semiconductor dynamic random access memory device.

Using the photo-resist etching mask, the silicon nitride layer 23 is selectively etched away, and the silicon oxide layer 22 is also selectively etched. As a result, the active areas are covered with the silicon oxide layer/silicon nitride layer 23, and a remaining area is exposed. The photo-resist etching mask is stripped off.

Using the silicon nitride layer 23 as a mask, the silicon substrate 21 is selectively oxidized, and a field oxide layer 24 is selectively grown to 4000 angstroms thick as shown in FIG. 4A.

The silicon nitride layer 23 and the silicon oxide layer 22 are etched away, and the active areas are exposed to the openings defined by the field oxide layer 24. Only one active area 25 is shown in FIGS. 4A to 4H, and description is focused on a semiconductor structure fabricated on the active area and adjacent field oxide layer.

Figure 4B:
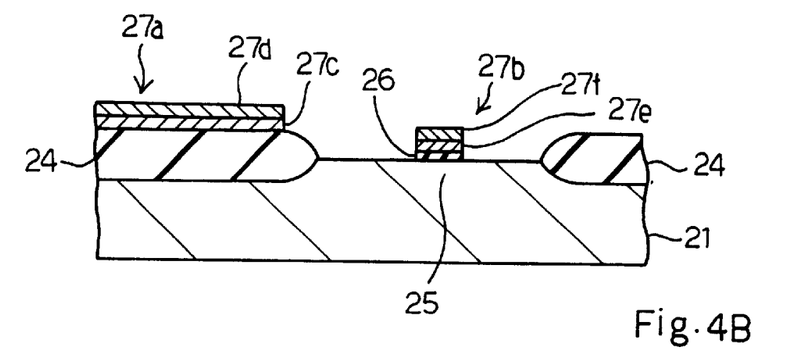

The active area is thermally oxidized, and a thin silicon oxide layer is grown to 100 angstroms thick. Polysilicon is deposited to 1000 angstroms thick over the entire surface of the resultant semiconductor structure, and phosphorous is doped into the polysilicon layer. Tungsten silicide is deposited to 1000 angstroms thick by using a chemical vapor deposition technique, and a tungsten silicon layer is laminated on the n-type doped polysilicon layer.

A photo-resist etching mask (not shown) is formed on the tungsten silicide layer by using the lithographic techniques, and the tungsten silicide layer, the n-type doped polysilicon and the silicon oxide layer are selectively etched. A gate oxide layer 26 is formed from the silicon oxide layer, and word lines 27a/27b are formed from the lamination of the n-type doped polysilicon layer and the tungsten silicide layer. FIG. 4B shows the word line 27a extending over the field oxide layer 24 and the other word line 27b extending over the gate oxide layer 26. Though not shown, the word lines 27a/27b further extend over other gate oxide layers (not shown) and the field oxide layer 24. The word line 27a consists of an n-type doped polysilicon layer 27c and a tungsten silicide layer 27d, and the other word line 27b also consists of an n-type doped polysilicon layer 27e and a tungsten silicide layer 27f. The word line 27b on the gate oxide layer 26 serves as a gate electrode of an n-channel enhancement type access transistor of a memory cell.

Using the gate electrode 27b as an ion-implantation mask, phosphorous is ion implanted into the active area 25 at dosage of $1 \times 10^{19}$ atom/square-cm, and forms source/drain regions 28a/28b on both sides of a channel region under the gate oxide layer 26.

Figure 4C:
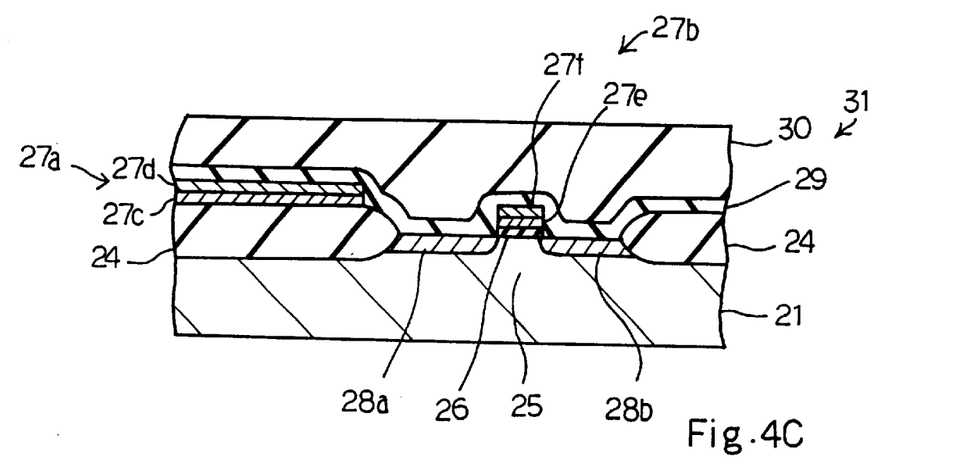

Subsequently, silicon oxide is deposited to 1000 angstroms thick over the entire surface of the resultant semiconductor structure by using a chemical vapor deposition, and forms a silicon oxide layer 29. Boro-phosphosilicate glass is deposited to 8000 angstroms thick, and forms a boro-phosphosilicate glass layer 30. The boro-phosphosilicate glass layer 30 is subjected to a chemical mechanical polishing, and a flat surface is created as shown in FIG. 4C. The silicon oxide layer 29 and the boro-phosphosilicate glass layer 30 as a whole constitute an inter-level insulating layer 31, and the inter-level insulating layer 31 over the drain region 28a is thicker than the inter-level insulating layer 31 over the word line 27a. In fact, the inter-level insulating layer 31 over the word line 27a is of the order of 3000 angstroms thick, and is increased to 7000 angstroms thick over the drain region 28a.

Figure 4D:
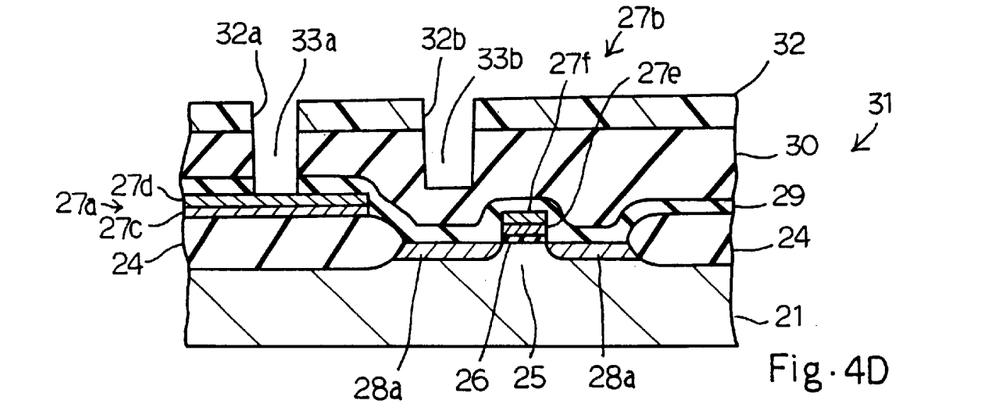

Subsequently, a photo-resist etching mask 32 is formed on the inter-level insulating layer 31 by using the photo-lithographic techniques. The photoresist etching mask 32 has openings 32a/32b as shown in FIG. 4D. The opening 32a is located over the word line 27a, and the other opening 32b is located over the drain region 28a.

Using the photo-resist etching mask 32, the inter-level insulating layer 31 is selectively etched for forming contact holes 33a/33b by using a plasma etching system. The contact holes 33a/33b are 0.3 micron to 0.4 micron in diameter, which is narrower than the diameter of the prior art contact holes ranging between 0.5 micron and 0.6 micron. In the plasma etching system, gaseous mixture of $CF_4$ and $CHF_3$ is supplied to the reactor (not shown) at 10 pa. The flow rate of $CF_4$ and the flow rate of $CHF_3$ are regulated to 30 sccm and 50 sccm, respectively. The plasma etching is continued for 30 seconds, and the tungsten silicide layer 27d is exposed to the contact hole 33a. However, the other contact hole 33b is incomplete, and the drain region 28a is still covered with the remaining inter-level insulating layer 31 as shown in FIG. 4D.

Figure 4E:
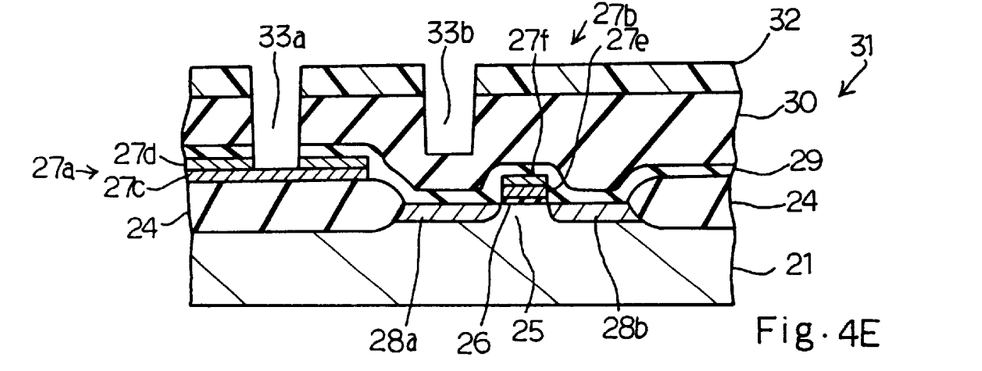

Subsequently, using the photo-resist etching mask 32, again, a part of the tungsten silicide layer 27d is etched away from the word line 27a by using the plasma etching system. Gaseous mixture of $HBr/SF_6$ is supplied to the reactor (not shown) at 60 milli-torr, and the flow rate of HBr and the flow rate of $SF_6$ are regulated to 70 sccm and 60 sccm, respectively. The plasma etching is continued for 10 seconds, and the n-type doped polysilicon layer 27c is exposed to the contact hole 33a as shown in FIG. 4E. The gaseous etchant has a large selectivity between the tungsten silicide and the boro-phosphosilicate glass/silicon oxide, and slightly decreases the thickness of the interlevel insulating layer 31.

The decrease is ignorable. For this reason, the contact hole 33b does not reach the drain region 28a.

Figure 4F:
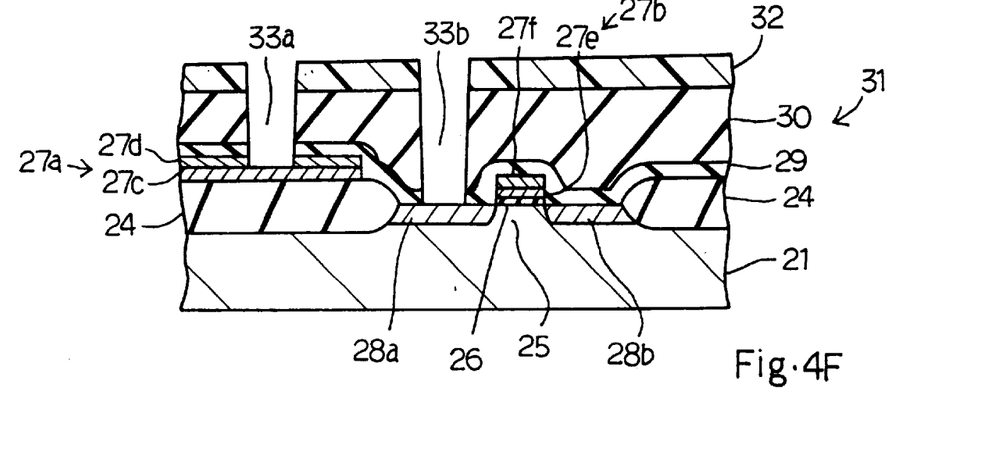

The gaseous mixture of $CF_4$ and $CHF_3$ is supplied to the reactor (not shown) under the same conditions, and the plasma etching is continued for 40 seconds. The contact hole 33b reaches the surface of the drain region 28a as shown in FIG. 4F, and is completed. The gaseous etchant has a large selectivity between the boro-phosphosilicate glass/silicon oxide and the n-type doped polysilicon, and slightly decreases the thickness of the n-type doped polysilicon layer 27c. The decrease is ignoreable. After completion of the contact holes 33a/33b, the photo-resist etching mask 32 is stripped off.

Subsequently, phosphorous-doped polysilicon is deposited to 1000 angstroms thick over the entire surface of the resultant semiconductor structure by using a chemical vapor deposition, and the phosphorous-doped polysilicon layer is held in contact with the n-type doped polysilicon layer 27c and the n-type drain region 28a. Tungsten silicide is deposited to 1000 angstroms thick over the n-type doped polysilicon layer by using the chemical vapor deposition, and the phosphorous-doped polysilicon layer and the tungsten silicide layer form in combination the polycide structure. The phosphorous-doped polysilicon layer and the tungsten silicide layer both deposited through the chemical vapor depositions achieve good step coverage.

Figure 4G:
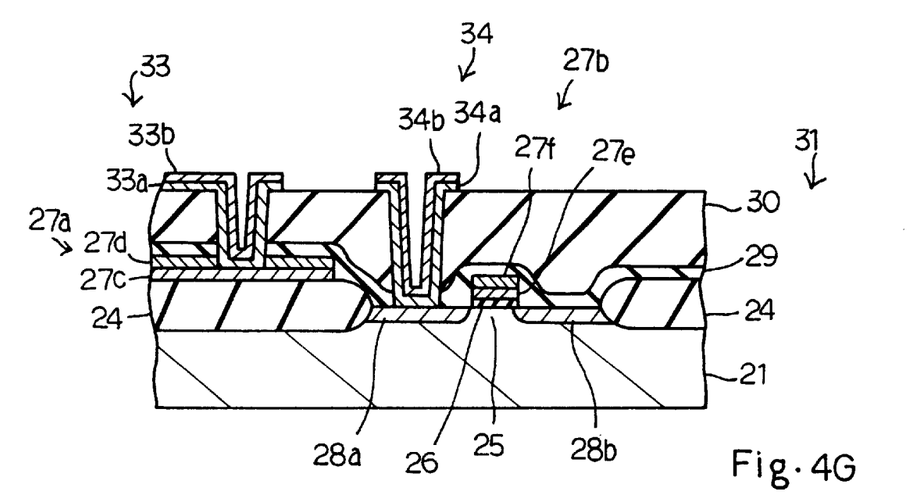

Subsequently, a photo-resist etching mask (not shown) is formed on the tungsten silicide layer by using the photolithographic techniques, and the tungsten silicide layer and the phosphorous-doped polysilicon layer are successively patterned into tungsten silicide strips 33a/33b and phosphorous-doped polysilicon strips 33b/34b by using etching techniques. The tungsten silicide strip 33a and the phosphorous-doped polysilicon strip 33b form an upper-level electrode 33, and the other tungsten silicide strip 34a and the phosphorous-doped polysilicon strip 34b form a digit line 34 as shown in FIG. 4G.

The polysilicon strip 33a is directly held in contact with the n-type doped polysilicon layer 27c, and the direct contact between the doped polysilicon layers 27c and 33a reduces the resistance between the upper-level electrode 33 and the word line 27a. Similarly, the phosphorous-doped polysilicon strip 34a is directly held in contact with the n-type drain region 28a of single crystal silicon, and the direct contact reduces the contact resistance between the digit line 34 and the n-type drain region 28a. Thus, the low contact resistance and the good step coverage are achieved through the process according to the present invention.

Moreover, the tungsten silicide layer 27d is partially removed from the word line 27a before the completion of the contact hole 33b. When the contact hole 33b reaches the surface of the n-type drain region 28a, the plasma etching is finished. The n-type drain region 28a is not depressed, and is thick enough to provide good electrical isolation between the digit line 34 and the silicon substrate 21. For this reason, the leakage current is drastically reduced.

Figure 4H:
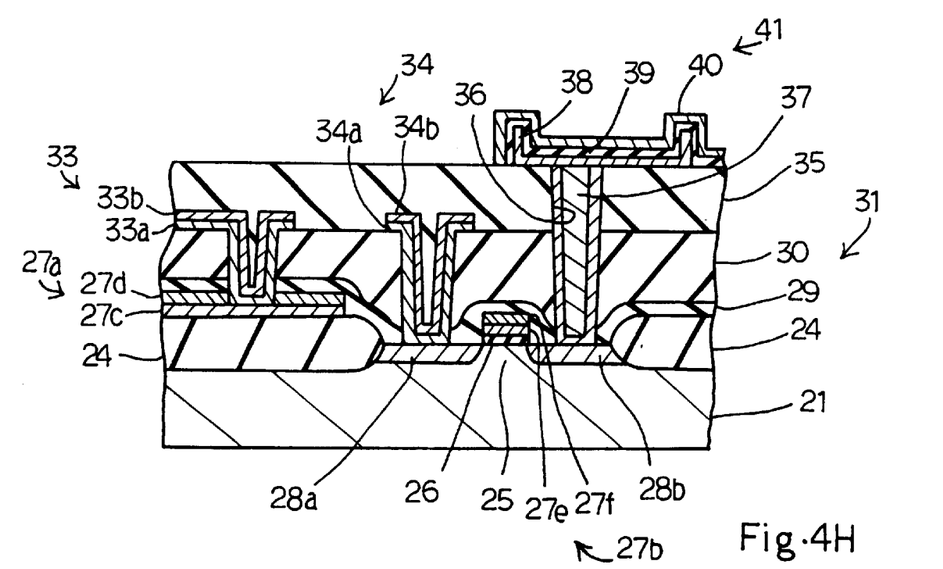

Subsequently, another inter-level insulating layer 35 is formed on the interlevel insulating layer 31, and a node contact hole 36 is formed in the interlevel insulating layers 31/35. The node contact hole 36 reaches the n-type source region 28b. The node contact hole 36 is plugged with a conductive column 37, and the conductive column 37 has the polycide structure. The conductive column or a contact plug 37 is held on contact with the n-type source region 28b. An accumulating electrode 38 is patterned on the interlevel insulating layer 35, and is held in contact with the conductive column 37. The accumulating electrode 38 is covered with a dielectric layer 39, and a plate electrode 40 is opposed to the accumulating electrode 38 through the dielectric layer 39 as shown in FIG. 4H. The accumulating electrode 38, the dielectric layer 39 and the plate electrode 40 as a whole constitute a storage capacitor 41.

As will be appreciated from the foregoing description, the inter-level insulating layer 31 over the n-type drain region 28a is thicker than the interlevel insulating layer 31 over the word line 27a, and the tungsten silicide layer 27d of the word line 31 is exposed to the contact hole 33a before the exposure of the n-type drain region 28a to the other contact hole 33b. This feature is desirable, because the manufacturer can remove the part of the tungsten silicide layer 27d without over-etching on the n-type drain region 28a. After the removal of the part of the tungsten silicide layer 27d, the remaining inter-level insulating layer 31 is etched away in order to complete the contact hole 33b. The manufacturer can easily control the end point of the etching process, and the surface of the n-type drain region 28a is never depressed. This means that the n-type drain region 28a is thick enough to offer appropriate electrical isolation, and the leakage current is drastically reduced.

The photo-resist etching mask 32 is available for the plasma etchings on the inter-level insulating layer 31, and the process sequence is as simple as the prior art process sequence. The second plasma etching is carried out under the same conditions as the first plasma etching, and any additional component is never required for the plasma etchings.

In this instance, the word line 27a and the source/drain region 28a serve as a first lower-level conductive line and a second lower-level conductive line, respectively.

Although a particular embodiment of the present invention has been shown and described, it will be apparent to those skilled in the art that various changes and modifications may be made without departing from the spirit and scope of the present invention.

Figure 5:
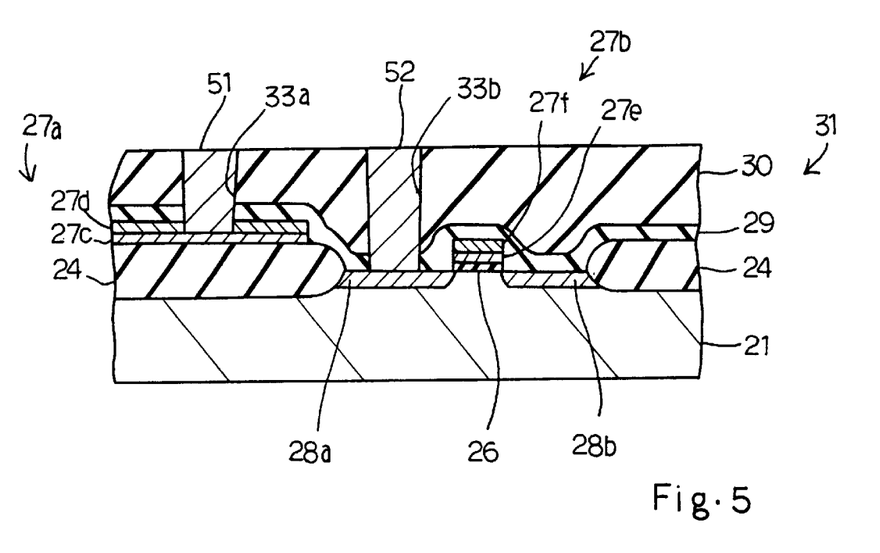
FIG. 5 is a cross sectional view showing the structure of another semiconductor integrated circuit device.

For example, the upper-level conductive lines may be formed of polysilicon strip or polysilicon contact plugs 51/52 as shown in FIG. 5. The polysilicon contact plugs 51/52 are formed as follows. After the contact holes 33a/33b are completed, polysilicon is deposited over the entire surface of the inter-level insulating layer 31. The polysilicon fills the contact holes 33a/33b, and forms a polysilicon layer on the inter-level insulating layer 31. The polysilicon layer is uniformly etched away without an etching mask until the inter-level insulating layer 31 appears. Then, the polysilicon contact plugs 51/52 are left in the contact holes 33a/33b. In this instance, the manufacturer forms any kind of upper-level conductive line on the inter-level insulating layer 31.

Both lower-level conductive lines may be formed by conductive line different in structure. The process according to the present invention is applicable to any kind of semiconductor integrated circuit device, and is never limited to a dynamic random access memory device.

In the above-described embodiment, the impurity region is formed after the polycide structure. However, the impurity region may be formed before the polycide structure in another example.

The inter-level insulating layer over the polycide line is thinner than the inter-level insulating layer over the impurity region. However, it is not important that the polycide lines extend over the impurity regions with respect to the major surface of the semiconductor substrate.

The refractory metal is never limited to tungsten. Other kinds of refractory metal such as, for example, titanium silicide or molybdenum silicide are available for the polycide structure. The refractory metal silicide may be formed through an alloying step.

Upon completion of the inter-level insulating layer, the inter-level insulating layer over the n-type source region 28a may be thicker than the interlevel insulating layer 31 over the word line 27a. If so, the chemical mechanical polishing is not carried out.

If a time lug takes place between the exposure of the refractory metal silicide layer and the exposure of the impurity region, the difference in thickness of the inter-level insulating layer is not an indispensable feature.

What is claimed is:

1. A process for fabricating a semiconductor device, comprising the steps of:
    a) preparing a semiconductor structure including a first lower-level conductive line having a semiconductor layer and a refractory metal silicide layer laminated on said semiconductor layer and a second lower-level conductive line without a refractory metal silicide layer;
    b) forming an inter-level insulating layer over said semiconductor structure having a first portion over said first lower-level conductive line and a second portion over said second lower-level conductive line;
    c) etching said first portion and said second portion until said refractory metal silicide layer of said first lower-level conductive line is exposed to a first contact hole, said second lower-level conductive line being still covered with a remaining second portion;
    d) removing a part of said refractory metal silicide layer exposed to said first contact hole from said first lower-level conductive line; and
    e) etching said remaining second portion for exposing said second lower-level conductive line to a second contact hole.

2. The process as set forth in claim 1, in which said second lower-level conductive line is an impurity region formed in a semiconductor substrate.

3. The process as set forth in claim 2, in which said step a) includes the sub-steps of
    a-1) preparing said semiconductor substrate,
    a-2) forming said first lower-level conductive line over said semiconductor substrate, and
    a-3) introducing a dopant impurity into said semiconductor substrate for forming said impurity region.

4. The process as set forth in claim 3, in which a third lower-level conductive line is formed over said semiconductor substrate concurrently with said first lower-level conductive line in said sub-step a-2), and said impurity region is formed in a self-aligned manner with said third lower-level conductive line.

5. The process as set forth in claim 2, in which said semiconductor substrate and said semiconductor layer are formed of single crystal silicon and polysilicon, respectively.

6. The process as set forth in claim 5, in which a first etchant used in said steps c) and e) has a large selectivity to an insulating material used for said inter-level insulating layer with respect to said refractory metal silicide, said polysilicon and said single crystal silicon, and a second etchant used in said step d) has a large selectivity to said refractory metal silicide with respect to said insulating material.

7. The process as set forth in claim 6, in which a photo-resist etching mask is used in said steps c), d) and e).

8. The process as set forth in claim 1, in which said second portion is thicker than said first portion.

9. The process as set forth in claim 8, in which said first lower-level conductive line extends higher than said second lower-level conductive line with respect to a major surface of a semiconductor substrate, and there is the step of creating a flat upper surface of said inter-level insulating layer between said step b) and said step c).

10. The process as set forth in claim 8, in which said second lower-level conductive line is an impurity region formed in a semiconductor substrate.

11. The process as set forth in claim 10, in which said step a) includes the sub-steps of
    a-1) preparing said semiconductor substrate,
    a-2) forming said first lower-level conductive line over said semiconductor substrate, and
    a-3) introducing a dopant impurity into said semiconductor substrate for forming said impurity region.

12. The process as set forth in claim 11, in which a third lower-level conductive line is formed over said semiconductor substrate concurrently with said first lower-level conductive line in said sub-step a-2), and said impurity region is formed in a self-aligned manner with said third lower-level conductive line.

13. The process as set forth in claim 1, further comprising the steps of
    f) forming a first upper-level conductive line held in contact with said semiconductor layer of said first lower-level conductive line through said first contact hole and a second upper-level conductive line held in contact with said second lower-level conductive line through said second contact hole.

14. The process as set forth in claim 13, in which said second portion is thicker than said first portion.

15. The process as set forth in claim 14, in which said first lower-level conductive line extends higher than said second lower-level conductive line with respect to a major surface of a semiconductor substrate, and there is the step of creating a flat upper surface of said inter-level insulating layer between said step b) and said step c).

16. The process as set forth in claim 15, in which said second lower-level conductive line is an impurity region formed in said semiconductor substrate.

17. The process as set forth in claim 16, in which said step a) includes the sub-steps of
    a-1) preparing said semiconductor substrate,
    a-2) forming said first lower-level conductive line over said semiconductor substrate, and
    a-3) introducing a dopant impurity into said semiconductor substrate for forming said impurity region.

18. The process as set forth in claim 17, in which a third lower-level conductive line is formed over said semiconductor substrate concurrently with said first lower-level conductive line in said sub-step a-2), and said impurity region is formed in a self-aligned manner with said third lower-level conductive line.

19. The process as set forth in claim 18, in which said third lower-level conductive line serves as a gate electrode formed on a gate insulating layer, and said impurity region serves as one of source and drain regions.

20. The process as set forth in claim 19, in which said gate electrode forms a part of a word line incorporated in a semiconductor memory device.

21. The process as set forth in claim 20, in which said semiconductor memory device is a dynamic random access memory device.

22. The process as set forth in claim 13, in which said first upper-level conductive line has a semiconductor layer directly held in contact with said semiconductor layer of said first lower-level conductive line.

23. The process as set forth in claim 22, in which said first upper-level conductive line further has a refractory metal silicide layer laminated on said semiconductor layer thereof.

24. The process as set forth in claim 13, in which said second upper-level conductive line has a semiconductor layer directly held in contact with said second lower-level conductive line formed of a semiconductor material.

25. The process as set forth in claim 24, in which said second upper-level conductive line further has a refractory metal silicide layer laminated on said semiconductor layer thereof.

26. A method of fabricating a semiconductor device, comprising:
   (a) forming a first conductor and a second conductor over a semiconductor substrate;
   (b) forming an insulating layer over the first conductor and the second conductor, wherein a first insulating layer portion of the insulating layer is located over the first conductor and a second insulating layer portion of the insulating layer is located over the second conductor;
   (c) etching the first insulating layer portion and the second insulating layer portion until the first conductor is exposed via a first contact hole, wherein a remaining second insulating layer portion of the second insulating layer portion still covers the second conductor when the first conductor is exposed;
   (d) removing a first portion of the first conductor that is exposed in the first contact hole; and
   (e) after the first portion of the first conductor is removed, etching the remaining second insulating layer portion to expose the second conductor via a second contact hole.

27. The method as claimed in claim 26, wherein the second insulating layer portion is thicker than the first insulating layer portion.

28. The method as claimed in claim 26,
   wherein the step (c) comprises:
      (c1) etching the first insulating layer portion with a first etching process, and wherein the step (d) comprises:
         (d1) removing the first portion of the first conductor with a second etching process.

29. The method as claimed in claim 28, wherein the step (e) comprises:
   (e1) etching the second insulating layer portion with the first etching process.

30. The method as claimed in claim 26, wherein the first conductor comprises a first semiconductor layer and a first refractory metal silicide layer formed over the first semiconductor layer, wherein the first portion of the first conductor is at least a portion of the first refractory metal silicide layer.

31. The method as claimed in claim 30, wherein the second conductor does not comprise a refractory metal silicide layer.

32. The method as claimed in claim 26, wherein the second conductor is a source/drain region.

33. The method as claimed in claim 31, wherein the second conductor is a source/drain region.

34. The method as claimed in claim 26, wherein the step (d) comprises:
   (d1) removing the first portion of the first conductor without removing a substantial portion of the remaining second insulating layer portion.

35. The method as claimed in claim 30, wherein the first portion comprises all of the first refractory metal silicide layer.

36. The method as claimed in claim 35, further comprising:
   (f) forming a third conductor in the first contact hole such that the third conductor contacts the first semiconductor layer.

37. The method as claimed in claim 36, wherein the third conductor comprises a second semiconductor layer and a conductive layer formed over the second semiconductor layer, and
   wherein the second semiconductor layer contacts the first semiconductor layer.

38. The method as claimed in claim 37, wherein the first and second semiconductor layers comprise polysilicon.

39. The method as claimed in claim 38, wherein the conductive layer of the third conductor comprises a refractory metal silicide layer.

40. A method of fabricating a semiconductor device, comprising:
   forming a polysilicon layer on a semiconductor substrate;
   forming a refractory metal silicide layer on said polysilicon layer;
   patterning said polysilicon layer and said refractory metal silicide layer into a lower level conductive line;
   forming a doped region in a major surface portion of said semiconductor substrate;
   forming an inter-level insulating layer that covers said semiconductor substrate and said lower-level conductive line;
   forming a mask over said inter-level insulating layer, wherein said mask has a first window over said lower-level conductive line and has a second window over said doped region;
   performing a first etching process using said mask to form a first contact hole and a second hole in said inter-level insulating layer,
      wherein said first contact hole is formed at a position corresponding to said first window and said second contact hole is formed at a position corresponding to said second window, and
      wherein said first etching process exposes said refractory metal silicide layer of said lower-level conductive line via said first contact hole while leaving said doped region unexposed via said second contact hole;
   performing a second etching process using said mask to remove said refractory metal silicide layer, which has been exposed in said first contact hole, to expose said polysilicon layer of said lower-level conductive line, wherein said second etching process leaves said doped region unexposed via said second contact hole; and
   performing a third etching process using said mask to expose said doped region via said second contact hole.

* * * * *